(12) United States Patent
Rapinoja et al.

(10) Patent No.: US 7,948,274 B2
(45) Date of Patent: May 24, 2011

(54) FREQUENCY GENERATION CIRCUITRY AND METHOD

(75) Inventors: Tapio Rapinoja, Kerava (FI); Liangge Xu, Espoo (FI)

(73) Assignee: Nokia Corporation, Espoo (FI)

( * ) Notice: Subject to any disclaimer, the term of this patent is extended or adjusted under 35 U.S.C. 154(b) by 97 days.

(21) Appl. No.: 12/570,068

(22) Filed: Sep. 30, 2009

(65) Prior Publication Data

US 2011/0074469 A1    Mar. 31, 2011

(51) Int. Cl.
*H03B 21/00*    (2006.01)
(52) U.S. Cl. ............ 327/107; 327/105; 327/106; 331/23
(58) Field of Classification Search .................. 327/105, 327/106, 107
See application file for complete search history.

(56) References Cited

U.S. PATENT DOCUMENTS

| | | | | |
|---|---|---|---|---|
| 4,984,186 | A | 1/1991 | Moerder | 364/721 |
| 5,563,535 | A | 10/1996 | Corry et al. | 327/105 |
| 6,891,420 | B2* | 5/2005 | Martin et al. | 327/260 |
| 2003/0119465 | A1* | 6/2003 | Martin et al. | 455/260 |
| 2005/0117071 | A1 | 6/2005 | Johnson | 348/729 |
| 2005/0266818 | A1 | 12/2005 | Johnson et al. | 455/260 |
| 2008/0285698 | A1* | 11/2008 | Mallinson | 375/376 |
| 2009/0015296 | A1* | 1/2009 | Chen et al. | 327/105 |

OTHER PUBLICATIONS

"A High-Resolution DLL-Based Digital-To-Time Converter for DDS Applications" 2002 IEEE International Frequency Control Symposium and PDA Exhibition; F. Baronti et al, pp. 649-653.
"Alternative Wideband Front-End Architectures for Multi-Standard Software Radios" 2004 IEEE, Mehmet R. Yuce et al. Sep. 26-29, 2004, vol. 3, sid. 1968-1972.
"A Direct Digital Period Synthesis Circuit", Dorin Emil Calbaza, IEEE Journal of Solid-State Circuits, vol. 37, No. 8, Aug. 2002, p. 1039-1045.
"A Digital Frequency Synthesizer for Cognitive Radio Spectrum Sensing Applications", Tapio Rapinoja, et al., IEEE Radio Frequency Integrated Circuits Symposium, 2009, p. 423-426.

* cited by examiner

*Primary Examiner* — Lincoln Donovan
*Assistant Examiner* — John W Poos
(74) *Attorney, Agent, or Firm* — Harrington & Smith (57) ABSTRACT

A method includes generating a plurality of reference phases of a reference signal and selecting a sub-phase from each of the plurality of reference phases to form a set of selected sub-phases. In the method selecting operates in response to synchronized outputs of a multi-phase phase accumulator that operates synchronously in accordance with one of the sub-phases of the set of sub-phases, and where the outputs of the multi-phase phase accumulator may be synchronized using at least one additional sub-phase.

24 Claims, 11 Drawing Sheets

FREQUENCY GENERATION CIRCUITRY AND METHOD

TECHNICAL FIELD

The exemplary and non-limiting embodiments of this invention relate generally to radio circuitry including radio receivers, to integrated circuits and to oscillator signal generation, such as local oscillator signal generation.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to be prior art by inclusion in this section.

The following abbreviations that may be found in the specification and/or the drawing figures are defined as follows:

DDPS direct digital period synthesis
IQ in phase-quadrature
LFSR linear feedback shift register
LO local oscillator
LSB least significant bit(s)
TD-DDS time-domain direct digital synthesizer Reference may be made to Dorin E. Calbaza, Yvon Savaria, "A Direct Digital Period Synthesis Circuit", IEEE Journal of Solid-State Circuits, Vol. 37, No. 8, August 2002, pgs. 1039-1045). The Calbaza et al. article proposes a DDPS architecture that allows a circuit output frequency to be higher than a reference frequency. A delay modulator, which takes additional bits from a phase accumulator output, is used to reduce the timing jitter level and thus the magnitude of spurs in the output.

Figure 11A:
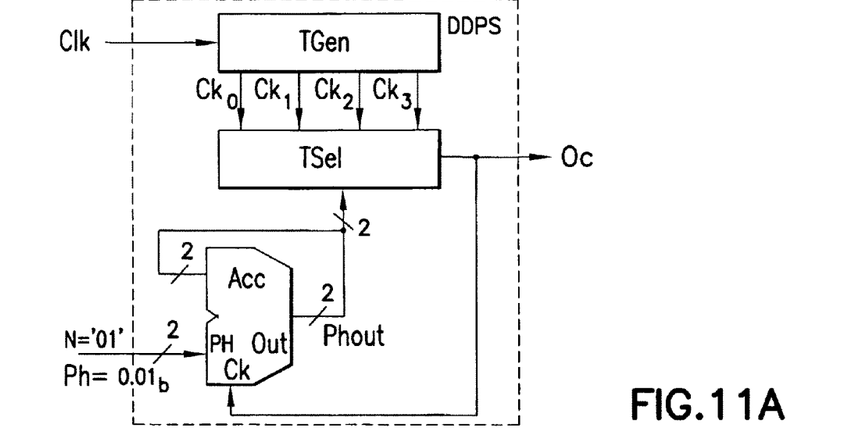
FIGS. 11A, 11B and 11C are circuit diagrams and a timing diagram of a conventional direct digital period synthesis circuit.
Figure 11B:
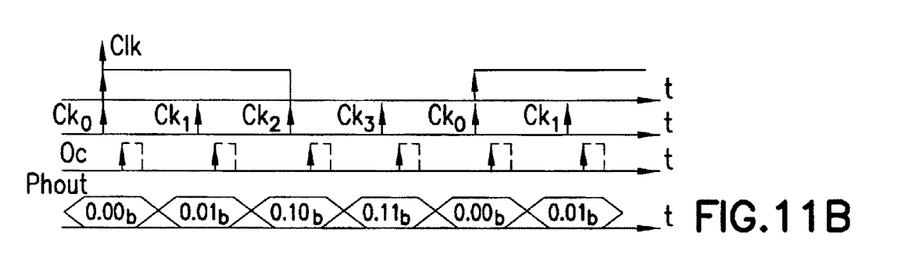
Figure 11C:
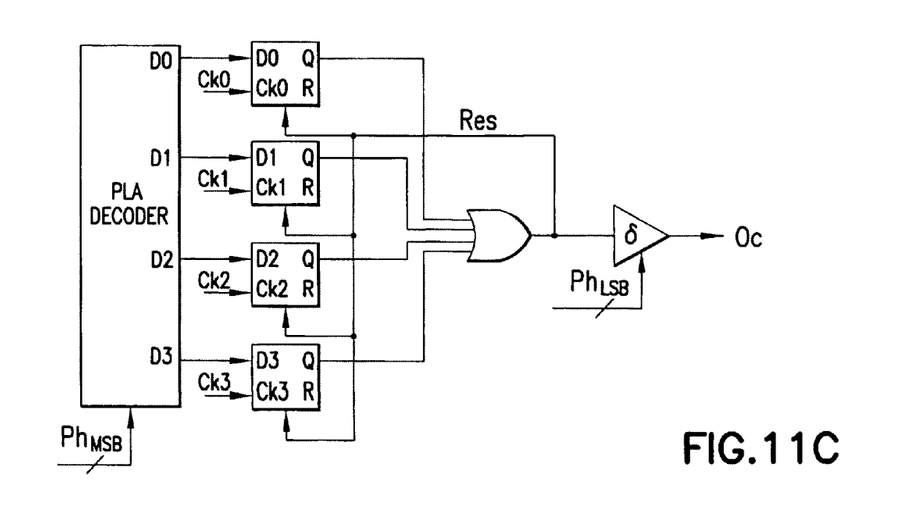

FIGS. 11A, 11B and 11C are circuit diagrams and a timing diagram of the direct digital period synthesis circuit proposed by Calbaza et al., and reproduce FIGS. 2, 3 and 4 of the Calbaza et al. publication.

As is stated in the Calbaza et al. publication, the DDPS can multiply a reference clock frequency with a fractional number. FIGS. 11A and 11B, respectively, present the general block diagram and the timing diagram of the DDPS circuit. Shown in FIG. 11A is a transition generator (TGen), which produces several output signals at the same frequency as the input reference clock (Clk), but with evenly distributed phases. A transition selector circuit (TSel) is responsible for selecting one of the transitions provided by the TGen. This transition is propagated to an output clock (Oc). Transition selection is done according to the output produced by a phase accumulator (Acc). The ability to select the transition that propagates to the output clock allows the DDPS to numerically control its output period. A conventional DLL-based frequency multiplier propagates transitions in their natural order and its output period is fixed.

The TGen circuit was implemented by using a differential ring oscillator composed of 32 differential buffers/inverters, connected as a ring oscillator. For instance, with a 3.2 ns ring oscillator period, the TGen can produce 64 derived copies of the clock with transitions delayed by 50 ps from each other. In this case, only the 6 most significant bits (MSBs) of the Acc output are used to select one of the 64 transitions. The propagated transition is also used to control the phase increment. To simplify the block diagram, the TSel was limited to four phases, $Ck_0$ to $Ck_3$, produced by the transition generator and selected according to the output of a 2-bit phase accumulator. Assuming a 3.2 ns period input clock, $Ck_0$ to $Ck_3$ are delayed from each other by 800 ps. By using Oc to control the phase Acc, its period can be made equal to a fraction of the Clk clock period (T), where the fraction is specified by the phase increment Ph.

The timing diagram of FIG. 11B presents the case for Ph=$0.01_b$, which is the binary representation of ¼. In response to clock pulses driving the Acc clock, the output phase goes from $0.00_b$ to $0.01_b$, $0.10_b$, $0.11_b$, and then the sequence repeats.

For example, assume that the circuit starts with an output phase equal to $0.00_b$. This selects $Ck_0$ to be propagated at the output Oc. After a propagation delay that particular transition will generate a pulse on Oc. That pulse will trigger the update of the Acc content that will become $0.01_b$, thus the next output phase becomes $0.01_b$, which will select $Ck_1$ for propagation to Oc. If the selected output phase changes sufficiently before the arrival of $Ck_1$ the DDPS acts as a frequency multiplier. The pulses at the Acc clock input change its digital output value according to the sequence $0.10_b$, $0.11_b$, $0.00_b$, $0.01_b$, and so on, selecting $Ck_2$, $Ck_3$, $Ck_0$, $Ck_1$, to be propagated to the output clock Oc. For another input phase number Ph=$0.11_b$ the output phase would follow the sequence $0.00_b$, $0.11_b$, $0.10_b$, $0.01_b$ and so on, giving an output period equal to three times the delay between $Ck_0$ and $Ck_1$.

The frequency of the output signal is given by $$fo_c = f_{Clk}/Ph,$$

where Ph<1 is the phase increment and $f_{Clk}$ is the frequency of any $Ck_i$ clock. Since Ph is less than 1, the output frequency is greater than the input clock frequency.

It is said by Calbaza et al. that a phase accumulator with a bit resolution larger than the number of bits required to address the inputs of the transition selector can express the output frequency with better precision. For instance, a 32-bit phase accumulator allows controlling the output clock frequency with sub-hertz precision. However, the time resolution of the output transitions and implicitly the output jitter, is determined by the time separation between the phases produced by the transition generator TGen.

The TSel selects one of the phases provided by TGen and propagates it to its output. Ideally, TSel propagates each phase with the same delay to avoid inducing jitter. Delay modulation can be included in the TSel circuit to improve the resolution of the DDPS. This reduces the theoretical jitter of the DDPS to a fraction of an inverter delay.

FIG. 11C is a block diagram of the TSel circuit. Again, to simplify the illustration, only the two MSBs of the phase accumulator output control the TSel circuit. The next two LSBs of the phase accumulator output are used to control the propagation delay through the output buffer. The circuit comprises a programmable logic array decoder (PLA decoder), four resettable D flip-flops, an OR gate, and a buffer with a controlled propagation time. The PLA decoder receives the 2 MSBs ($PH_{MSB}$) of the phase accumulator and sets the D0-D3 lines according to the received code. The PLA was used for convenience, and it also occupies a small size, due to its regular layout structure, and produces a small delay since transistors are connected in parallel.

For instance, if $PH_{MSB}$=0.1, D1 will be at 1. Thus, $Ck_1$ is selected and when its rising edge arrives, the corresponding line becomes '1'. This '1' propagates through the OR gate, resetting all of the D flip-flops and generating a pulse to the output clock Oc. The pulse on Oc activates the phase accumulator, selecting a new phase to be propagated, as discussed above.

It is said by Calbaza et al. that it is important to equalize the propagation delays from the selected $Ck_i$ (i=0-3) to the output of the OR gate, since variations of this propagation delay cause jitter. Considering a 500 ps propagation delay, a 5% mismatch would produce about 25 ps period jitter.

It is also said by Calbaza et al. that the time resolution of TSel can be improved with a delay modulator that may be implemented with a buffer controlled by the 2 bits of the output phase of Acc ($PH_{LSB}$) that directly follow the set of MSBs used to control the PLA decoder. These two bits are said to modulate the propagation delay through the buffer.

However, following the techniques disclosed by Calbaza et al. undesirable spurs in the output spectrum appear due to truncation of the phase accumulator output.

In "A Digital Frequency Synthesizer for Cognitive Radio Spectrum Sensing Applications", Tapio Rapinoja, Kari Stadius, Liangge Xu, Saska Lindfors, Risto Kaunisto, Aarno Pärssinen and Jussi Ryynanen, IEEE Radio Frequency Integrated Circuits Symposium 2009, June 2009, pgs. 423-426, there is disclosed an enhancement to the DDDS, more specifically a TD-DDS architecture. Reference may also be made to commonly owned U.S. patent application Ser. No. 12/291,255, filed Nov. 6, 2008, "Frequency Synthesizer Having a Plurality of Independent Output Tones", Saska Lindfors et al., incorporated by reference herein.

SUMMARY

The foregoing and other problems are overcome, and other advantages are realized, by the use of the exemplary embodiments of this invention.

In a first aspect thereof the exemplary embodiments of this invention provide a method that includes generating a plurality of reference phases of a reference signal and selecting a sub-phase from each of the plurality of reference phases to form a set of selected sub-phases. In the method selecting operates in response to synchronized outputs of a multi-phase phase accumulator that operates synchronously in accordance with one of the sub-phases of the set of sub-phases, and where the outputs of the multi-phase phase accumulator are synchronized In another aspect thereof the exemplary embodiments of this invention provide a frequency synthesizer that comprises a transition generator; a set of transition selectors having inputs connected outputs of said transition generator; a multi-phase phase accumulator; a synchronizer having inputs connected to a plurality of outputs of said multi-phase phase accumulator and outputs connected to control inputs of said set of transition selectors, said synchronizer operating using at least one sub-phase for synchronizing the outputs of said multi-phase phase accumulator; rising and falling edge combiners having inputs connected to outputs of said set of transition selectors; and sub-phase combiners having inputs connected to outputs of said rising and falling edge combiners.

BRIEF DESCRIPTION OF THE DRAWINGS

In the attached Drawing Figures:

FIG. 7 depicts the output waveform without (7a) and with (7b) falling edge generation.

DETAILED DESCRIPTION

Fundamentally the highest achievable output frequency of the TD-DDS architecture is limited by the delay through the digital accumulator. In accordance with the exemplary embodiments of this invention the TD-DDS architecture is enhanced in a novel manner to achieve a higher output frequency.

Figure 1:
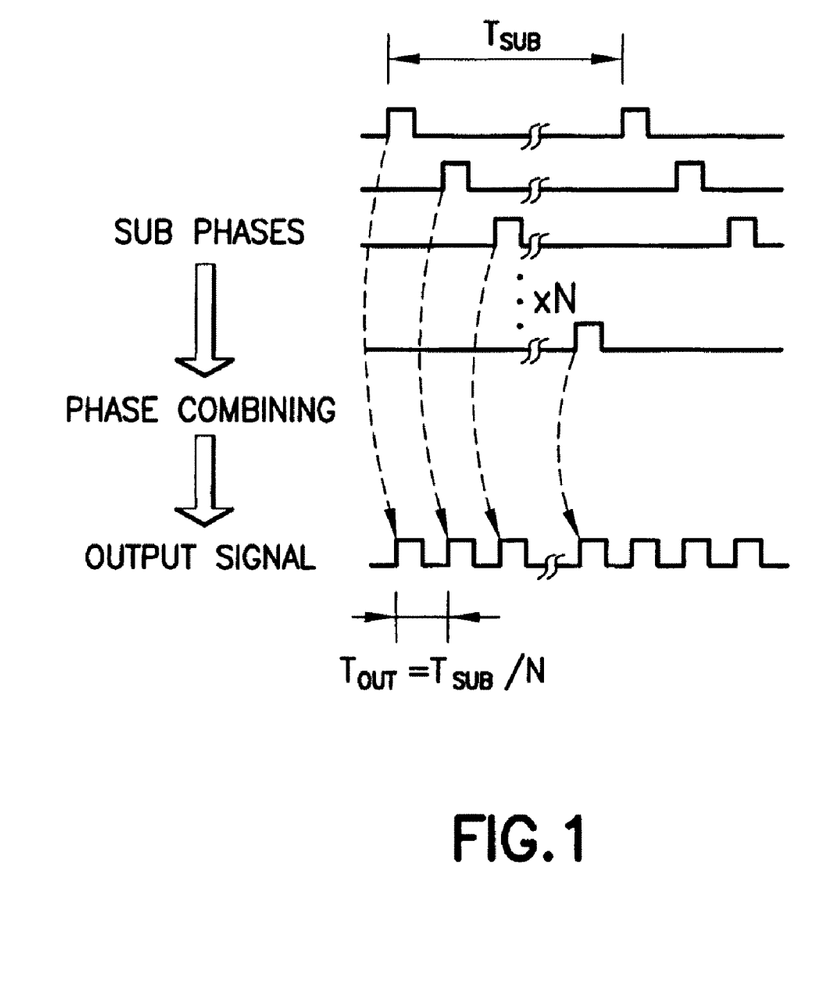
FIG. 1 shows a frequency increment that can be achieved by combining sub-phases.

The TD-DDS architecture is exploited to create multiple accurate phase signals that are combined to a higher frequency signal. The phase information of successive output pulses are accumulated simultaneously and thereafter used to generate sub-phases. These phases form the successive output pulses when they are combined, as depicted in FIG. 1, which shows the frequency increment achieved by combining sub-phases.

A multiple phase approach in accordance with the exemplary embodiments of this invention increases the time available for phase accumulation and thus the maximum achievable output frequency. This technique is used to achieve a higher operational frequency of the LO generation circuitry. Furthermore, the technique can be utilized for falling edge generation, thereby eliminating spurious tones due to pulse-width modulation. The generation of IQ signals may be accommodated by the disclosed architecture.

It should be noted that pulse width modulation may not be an issue in all applications, especially in those which only utilize the rising edges of the synthesizer output signals. However, it has been observed that the pulse width modulation can in fact create spurious tones when a passive mixer is used for down-conversion due to the dc level fluctuation of the output signal. The use of falling edge generation cancels the fluctuation by setting the duty cycle of the output signal to be constant. A falling edge generation with 50% duty-cycle is also discussed below. Note, however, that other duty-cycles can be implemented with the same technique.

Figure 7:
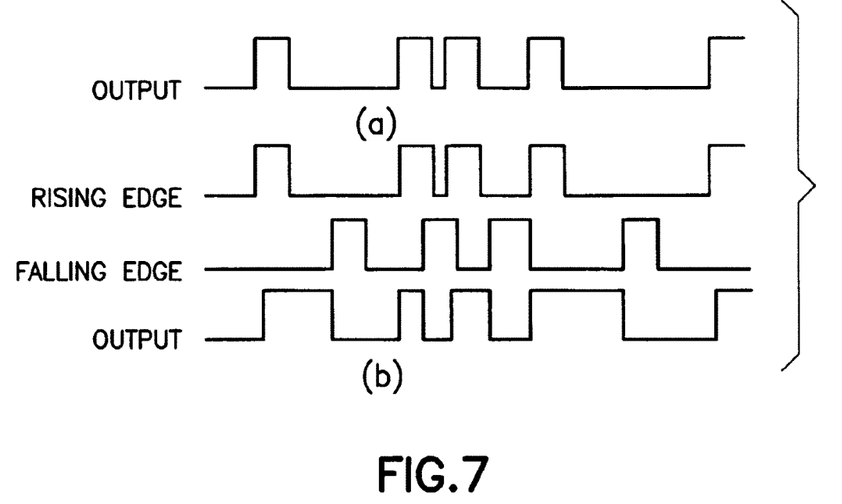

Referring to FIG. 7a, the fluctuation in periodic form will generate spurious tones and in random form raise the noise level when fed to the passive mixer. The fluctuation can be cancelled by generating both the rising edge and the falling edge independently and combining them as an output signal with constant duty-cycle. FIG. 7b depicts the output signal with constant duty-cycle of 50%, however as was noted above other duty-cycle values can be utilized.

The exemplary embodiments of this invention encompass an enhanced digital multi-phase phase-accumulator as well as top level synchronization. The frequency synthesizer architecture may be utilized, as one non-limiting exemplary embodiment, in a wide-band high-frequency cognitive radio LO generator.

The multi-phase frequency synthesizer architecture utilizes the accurate waveforms of TD-DDS to provide high frequency operation, falling edge generation for spurious signal cancellation, as well as IQ signal generation.

The TD-DDS architecture that is utilized by the exemplary embodiments of this invention may be based on that described in the above-referenced U.S. patent application Ser. No. 12/291,255. The exemplary embodiments of this invention have a number of aspects, including an enhanced frequency synthesizer architecture and related blocks, including a multi-phase phase accumulator and synchronization.

As was noted above, the maximum output frequency of the TD-DDS architecture is fundamentally limited by the delay of the digital accumulator. An aspect of these exemplary embodiments is to use the TD-DDS architecture in a manner that enables higher frequencies to be achieved.

A first aspect of this enhancement is to accumulate the phase information of successive output pulses with a digital phase accumulator using one triggering. This accumulation can include altogether or separately the phase information of rising and falling edges, as well as IQ signals.

A second aspect of this enhancement is the use of controls to provide sub-phases that form successive output pulses when they are combined, as depicted in FIG. 1. For example, it is possible to achieve on the order of a $f_{OUT,NEW}=4*f_{OUT,OLD}$ increment in the output frequency with eight sub-phases.

Figure 2A:
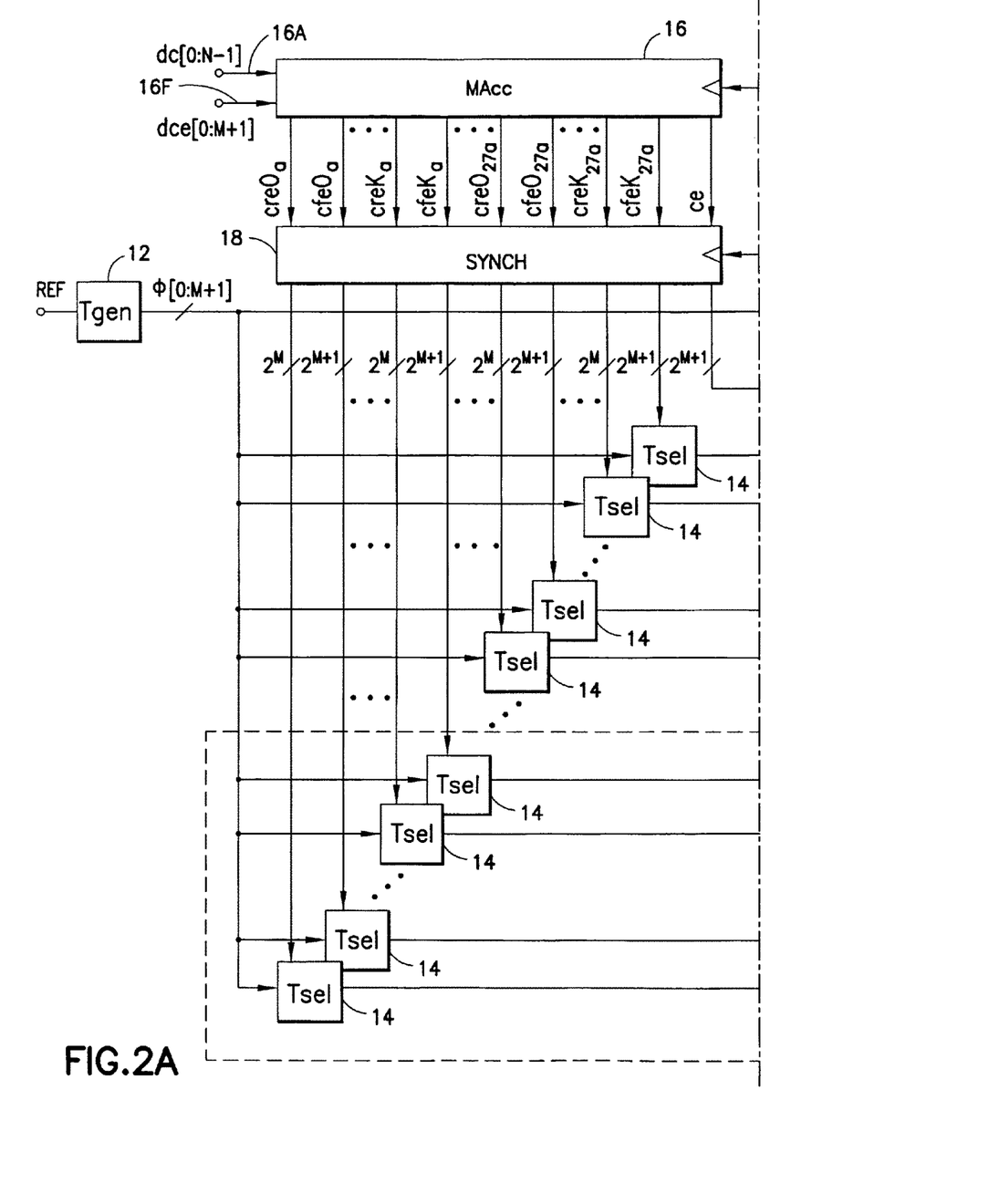
FIG. 2 is a block diagram of frequency synthesizer architecture in accordance with the exemplary embodiments of this invention.
Figure 2B:
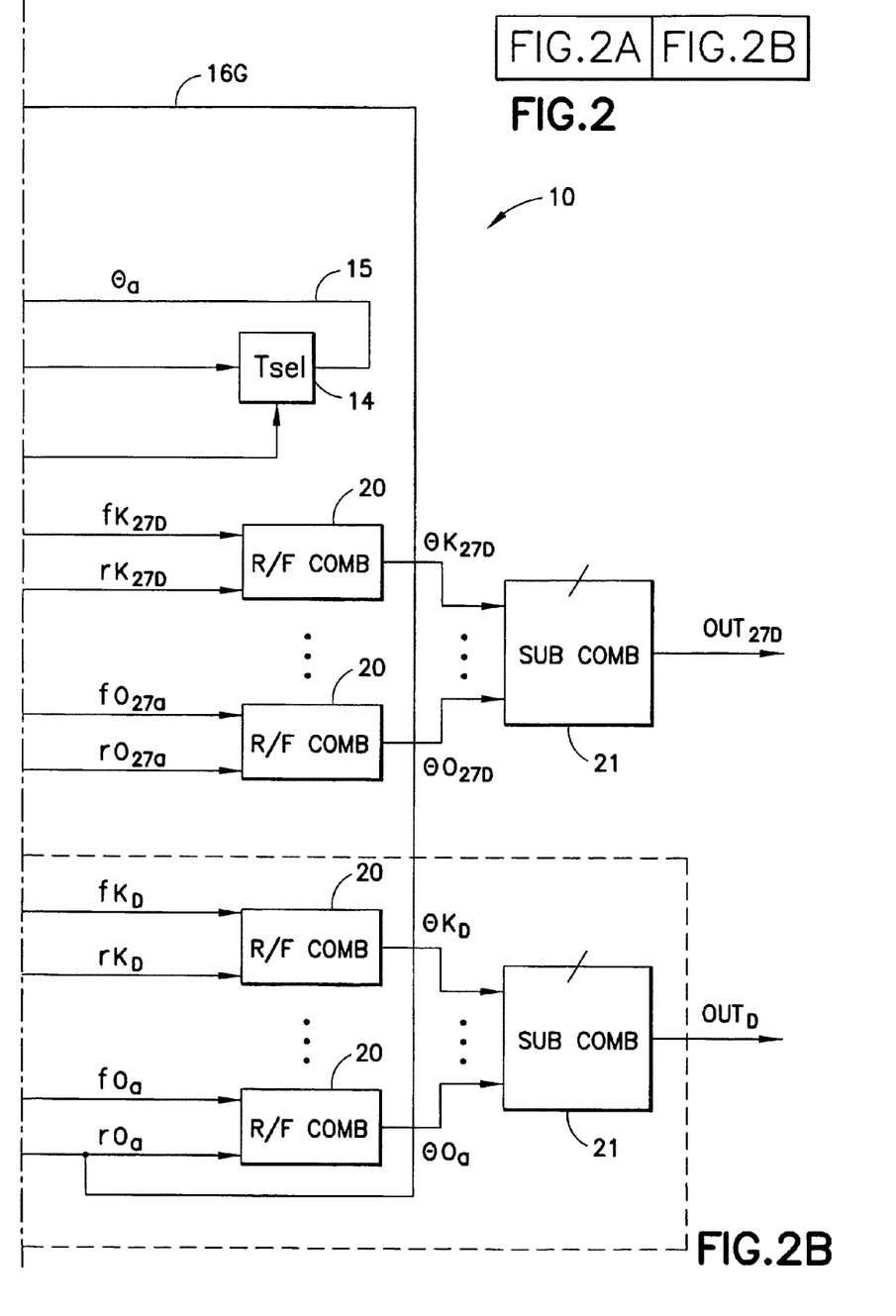
Figure 8:
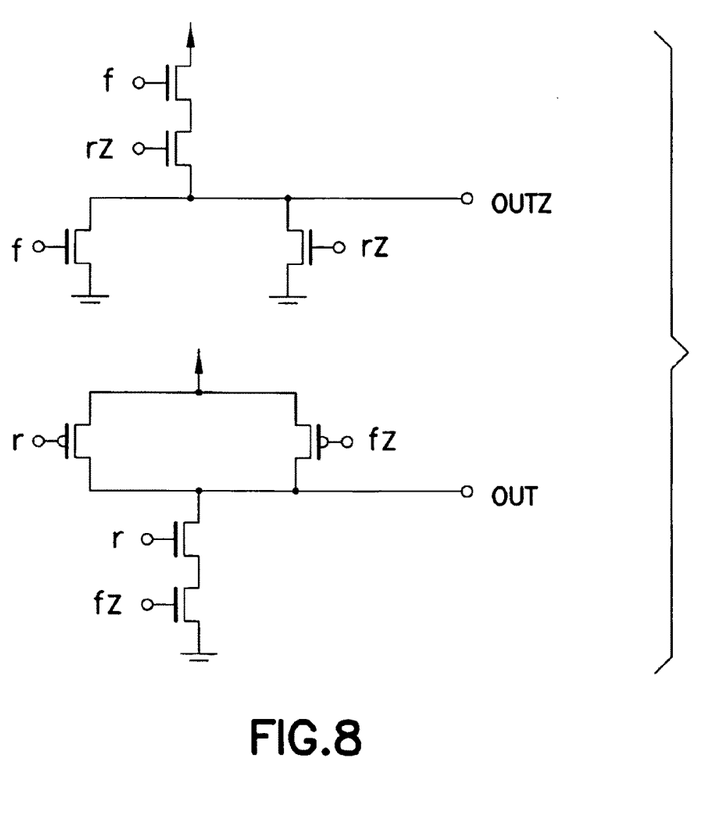
FIG. 8 is a simplified diagram of a rising and falling edge combiner.
Figure 9:
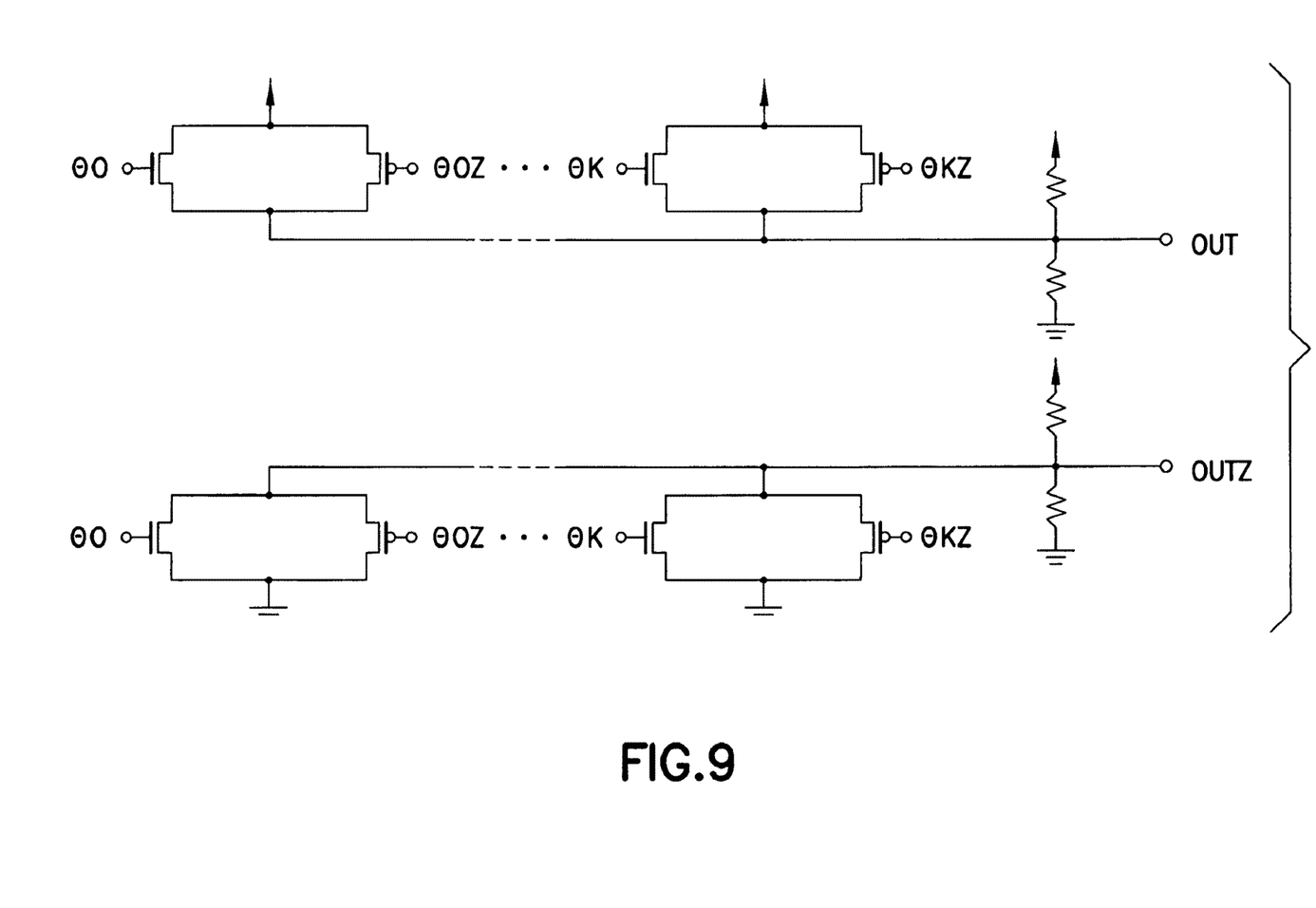
FIG. 9 is a simplified diagram of a sub-phase combiner.

A block diagram of the enhanced frequency synthesizer architecture is shown in FIG. 2. A frequency synthesizer 10 includes a transition generator (Tgen) 12, a set of transition selectors (Tsel) 14, a multi-phase phase-accumulator (MAcc) 16, a synchronizer (Synch) 18, a rising and falling edge combiner (R/F comb) 20, and a sub-phase combiner (Sub comb) 21. This synthesizer produces IQ-signal with 0, 90, 180 and 270 degrees (OUT0, OUT90, OUT180, and OUT270) and utilizes K+1 sub-phases ($\theta 0$-$\theta K$) to achieve high frequency operation. The wanted output frequency is generated from N-bit digital frequency control word (dc[0:N−1]) 16A by the multi-phase phase accumulator 16. For each IQ-signal with 0, 90, 180 and 270 degrees, this phase accumulator 16 provides the phase information (cre0-creK, cfe0-cfeK), which is utilized by the transition selection blocks 14 in the generation of the rising (r0-rK) and falling (f0-fK) edges of each sub-phase ($\theta 0$-$\theta K$). The sub-phases generated by the rising and falling edge combiner 20 are further combined to a high frequency output signal by the sub-phase combiner 21. The rising and falling edge combiner, depicted in FIG. 8, utilizes a logical AND-function, where the falling edge phase information is inverted. Correspondingly, the sub-phases combiner 21, depicted in FIG. 9, combines the successive sub-phases to a higher frequency signal by utilizing a logical OR-function. The synchronization unit 18 guarantees that the different sub-phases are selected in the correct order to enable sub-phase combining into a higher frequency output signal. The use of the additional sub-phase 15 for synchronization considerably eases the timing requirements of the entire feedback loop and thus enables higher output frequencies to be generated. This sub-phase 15 is generated from control word dce[0:M+1] 16F by the multi-phase phase-accumulator 16 and also utilizes an additional transition selector 14. Note however, in some cases the synchronization 18 may utilize already-generated sub-phases, and more precisely the rising edges (r0-rK), and in this case no additional sub-phases would be required to be generated for synchronization purposes. For example, one such case would be to use the synthesizer 10 only for IQ generation at frequencies below 1 GHz. Note that the transition generator 12 has to provide a two times smaller reference phase difference to enable the falling edge, and four times smaller to enable IQ generation. Moreover, it should be also noted, that if this architecture is used only for IQ generation without pursuing high frequency operation with sub-phases, the sub-phase combiner 21 is not required.

The synchronization is an important element when multiple sub-phases are used. There are at least two techniques to implement the synchronization. In a first technique, referred to for convenience as half-synchronization (FIG. 3), the data propagation to the transition selector 14 is synchronized only once during each multi-phase accumulation. In a second technique, referred to for convenience as full-synchronization (FIG. 4), the data propagation is synchronized with each output cycle.

Figure 3:
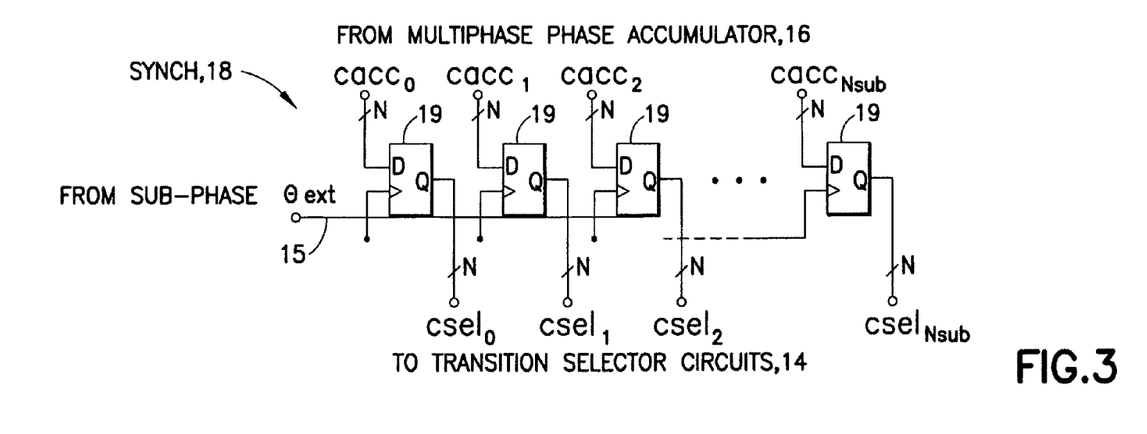
FIG. 3 is a block diagram of a half-synchronization architecture in accordance with the exemplary embodiments of this invention.
Figure 4:
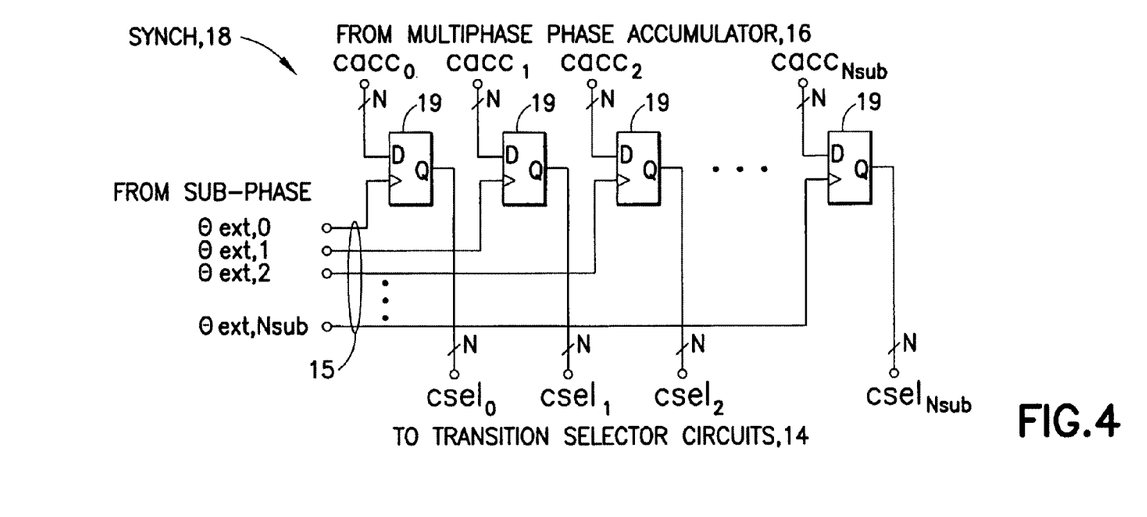
FIG. 4 is a block diagram of a full-synchronization architecture in accordance with the exemplary embodiments of this invention.

In FIG. 3 the Synch 18 is shown to include a plurality of D flip-flops 19, each clocked with the $\theta_{ext}$ signal 15, having D inputs that are connected to respective MAcc 16 outputs $cacc_0$-$cacc_{Nsub}$, and Q outputs connected to the respective Tsel 14. In FIG. 4 the Synch 18 is similarly constructed, but the clock inputs, instead of all being connected to the common $\theta_{ext}$ signal 15, are each connected to a respective $\theta_{ext}$ signal ($\theta_{ext,0}$, $\theta_{ext,1}$, ..., $\theta_{ext,Nsub}$).

The half-synchronization approach reduces the frequency range of the synthesizer 10, but is more readily implemented and, in addition, exhibits relaxed timing constraints as compared to the full-synchronization approach. Both of these synchronization approaches may utilize additional sub-phases that depend from the original sub-phases for clocking to ease the timing requirements when high frequency operation is desired. However, the use of the additional sub-phases may tend to increase the needed chip area and increase power dissipation.

Note that for the full-synchronization approach of FIG. 4 the Tsel that generates the $\theta_{ext}$ signal is replicated Nsub times to generate the required Nsub clocks. However, this may not be as attractive from a hardware implementation point of view since it increases the amount of required Tsel blocks by a factor of two. That is, if Nsub phases are used for frequency generation an additional Nsub phases are required for synchronization resulting in a total of 2*Nsub sub-phases. Note further that this approach is desirable only when high frequency operation is pursued, and the timing constraints have are fulfilled by using additional sub-phases for synchronization. As was noted above, with lower frequencies (e.g., IQ generation at frequencies below 1 GHz) the full and half synchronization could utilize the "normal" sub-phases and no additional sub-phases would be needed. In such a case the full synchronization approach would be the more attractive embodiment.

Figure 5A:
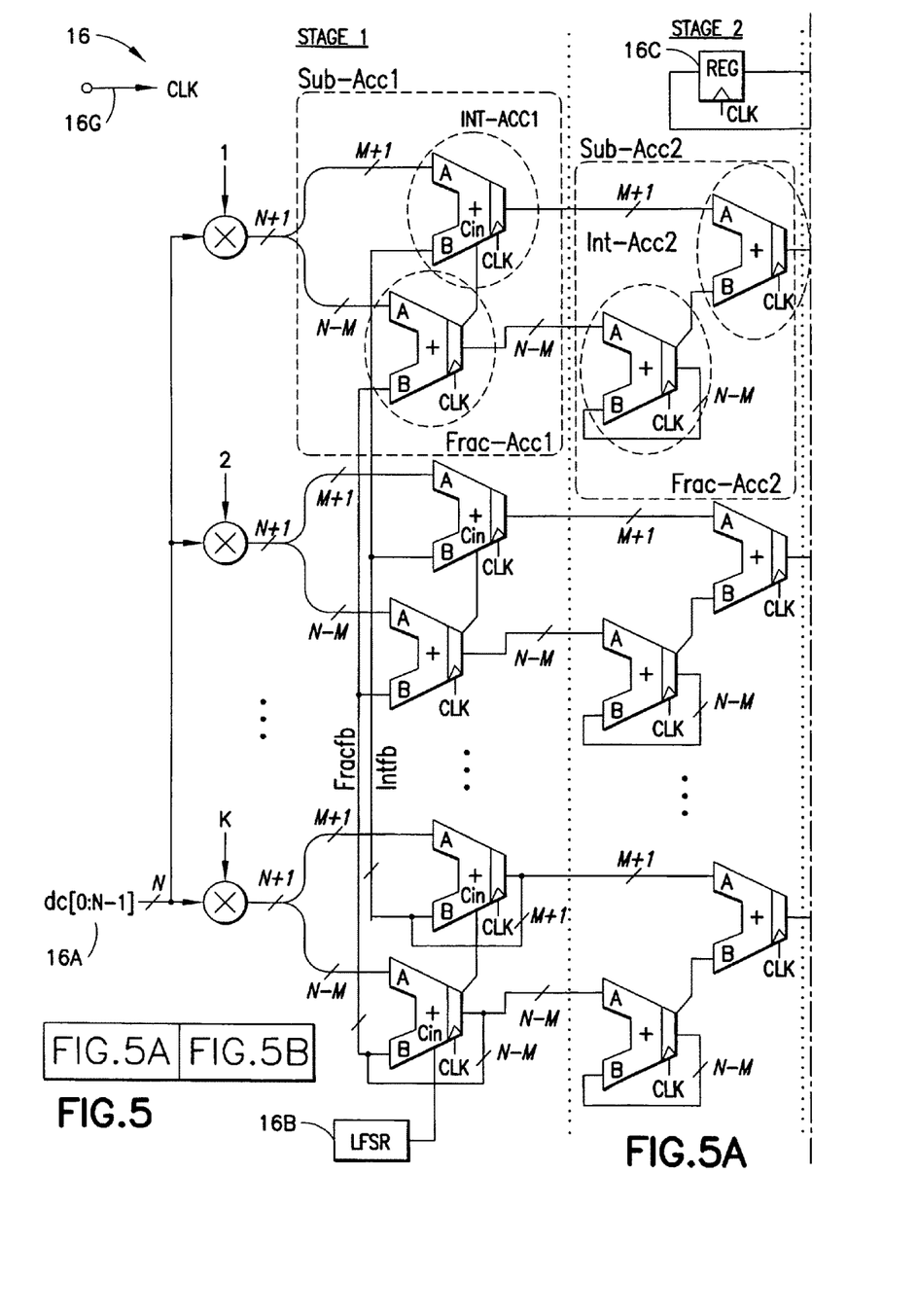
FIG. 5 is a block diagram of a 2nd-order sigma-delta multiphase phase accumulator.
Figure 5B:
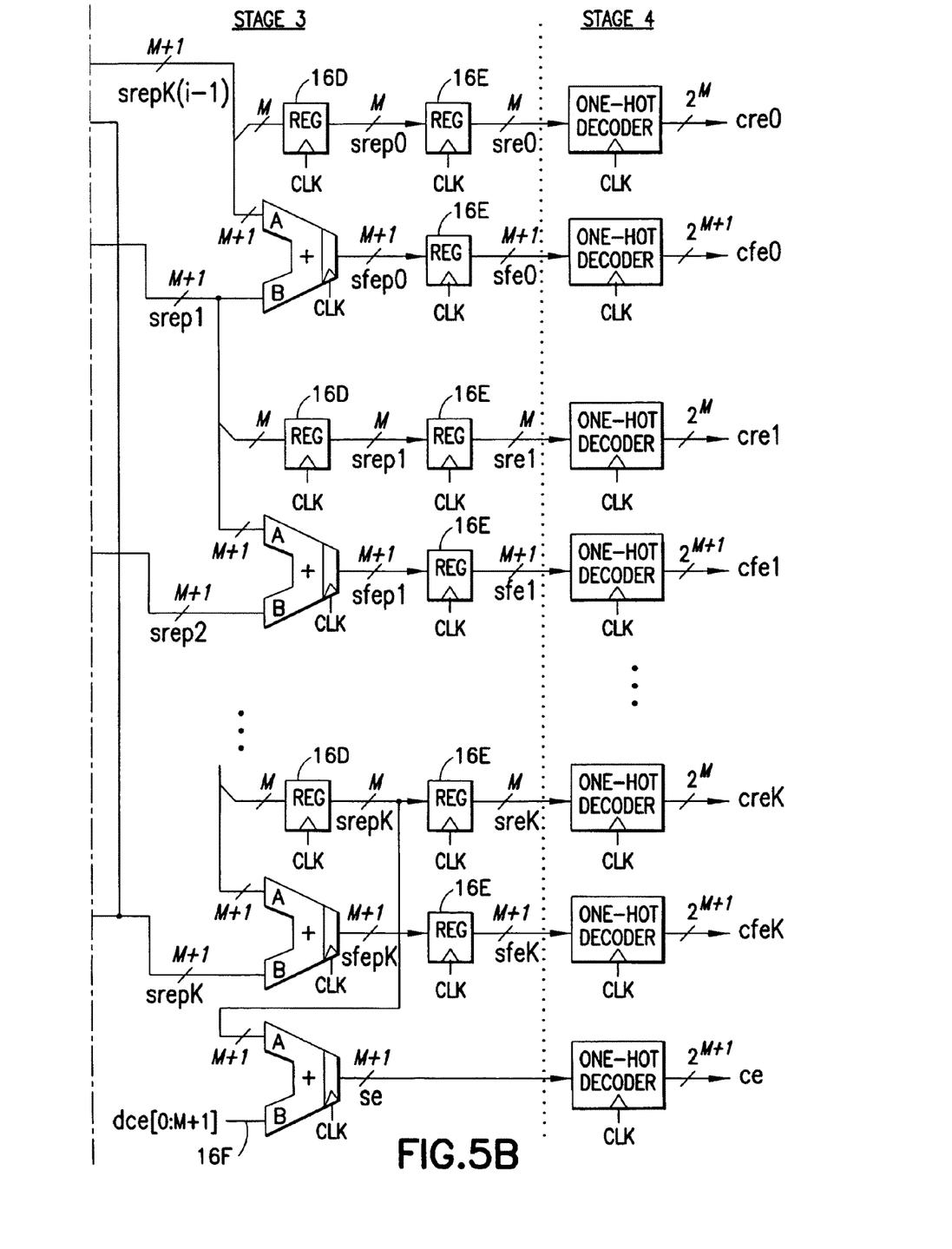

FIG. 5 shows an exemplary embodiment of a (K+1)-phase $2^{nd}$-order sigma-delta multi-phase phase accumulator with one-hot coded outputs, which is one suitable embodiment of the multi-phase accumulator 16. As is well-known, in digital circuits "one-hot" refers to a group of bits among which the legal combinations of values are only those with a single high (1) bit and all other bits being low (0). The MAcc 16 function is to generate one-hot coded phase information (cer0-cerK, cef0-cefK, ce) to be used in a time-interleaved manner by the subsequent transition selectors 14. The phase information of the desired output frequency of the synthesizer 10 is generated from an N-bit digital control word dc[0:N−1] 16A. The control word represents a fixed-point number (with M integer bits and N-M fraction bits) that defines the period of the frequency synthesizer output in terms of transition generator 12 unit delays. As such, N bits and M bits define the integer and fractional parts of the digital control word 16A, and these values will, in part, define the frequency range and the frequency resolution of the synthesizer 10. As a non-limiting example, N=26 and M=5.

Figure 10A:
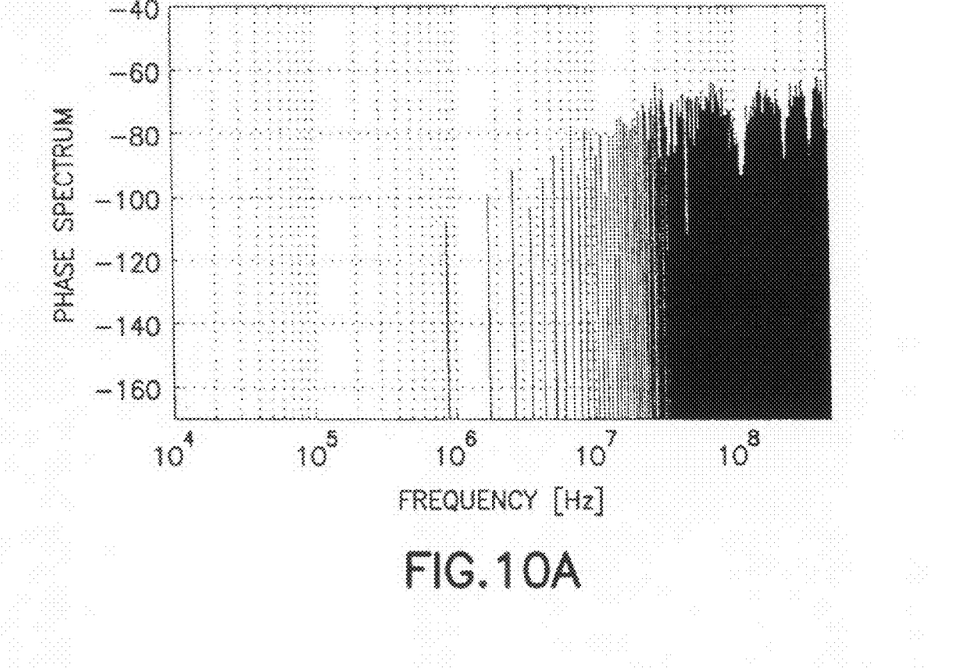
FIGS. 10A and 10B show a simulated 8-phase DDPS phase noise with dithering off and dithering on, respectively.
Figure 10B:
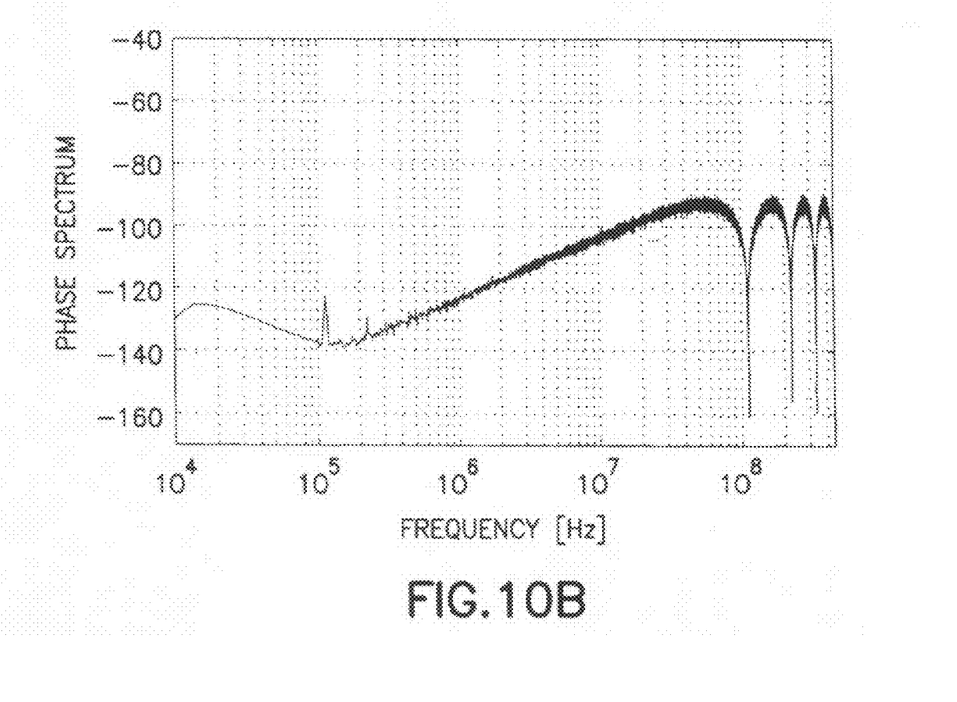

The exemplary embodiment of the multi-phase phase accumulator 16 includes four stages. Stages 1 and 2 provide the actual phase accumulation of rising edges. The stage 3 generates the phase information of falling edges. The stage 4 is used for the one-hot decoding of digital phase information. The stage 1 is constructed to have of K sub-accumulators denoted as Sub-Acc1. In each of these sub-accumulators the accumulation is performed in two parts, i.e., an integer (Int-Acc1) part and a fractional (Frac-Acc1) part, which correspond to the fixed-point representation of the digital frequency control word 16A. The multi-phase phase information (cer0-cerK, cef0-cefK) needed for the sub-phase generation in the transition selector units 14 is mainly performed in stage 1 by multiplying each sub-accumulator input with a sequential integer that corresponds to the order of the sub-phase, and feeding the outputs of last sub-accumulator to the inputs of the other sub-accumulators (denoted as Intfb and Fracfb in FIG. 5). The first stage also includes a structure to generate pseudo-random data, embodied here in a non-limiting embodiment as a linear feedback shift register (LFSR) 16B. The generated pseudo-random bit is used as the carry-in to the fractional accumulator to produce LSB dithering for the sigma-delta modulation. This beneficially suppresses spurious tones that otherwise could arise at certain output frequencies. Simulated output spectra of the synthesizer 10 with the dithering turned off and turned on are shown in FIGS. 10A and 10B, respectively.

The second stage of the multi-phase phase accumulator introduces second-order sigma-delta modulation. As in stage 1, stage 2 also contains K sub-accumulators (Sub-Acc2), each having the integer (Int-Acc2) and fractional (Frac-Acc2) parts. In this stage the register (REG) 16C introduces a unit delay and therefore provides the previous sum (srepK(i−1)) of the last sub-accumulator which is used for falling edge phase information generation in stage 3. The outputs of stage 2 (srep0-srepK) form the rising edge phase information.

The stage 3 generates the falling edge phase information by using adders that form the average of two neighboring rising edge phase information. Therefore, the generation of first sub-phase falling edge information sfep0 requires the information of the last rising edge of previous accumulation cycle, which is provided by the register 16C of stage 2. Stage 3 also includes the generation of the additional sub-phase phase information used for synchronization (ce). This information is generated from the last sub-phase rising edge phase information srepK by adding the (M+1)-bit digital control word dce[0:M+1] 16F to it. In this stage, the first registers 16D store rising edge phase information (srep0-srepK) provide unit delay to synchronize it with the falling edge phase information (sfep0-sfepK). The next registers 16E register both rising and falling edge phase information and synchronize the additional phase information to stage 4, where the binary phase information is coded in one-hot format. The IQ signal phase information generation can be produced in a similar fashion as the falling edge phase information in stage 3. For convenience the IQ generation is not presented in this example.

Note that the various registers 16C, 16D and 16E are all clocked with the same clock (clk) 16G obtained, in this embodiment, from rising edge signal $r0_0$ (see FIG. 2).

Figure 6:
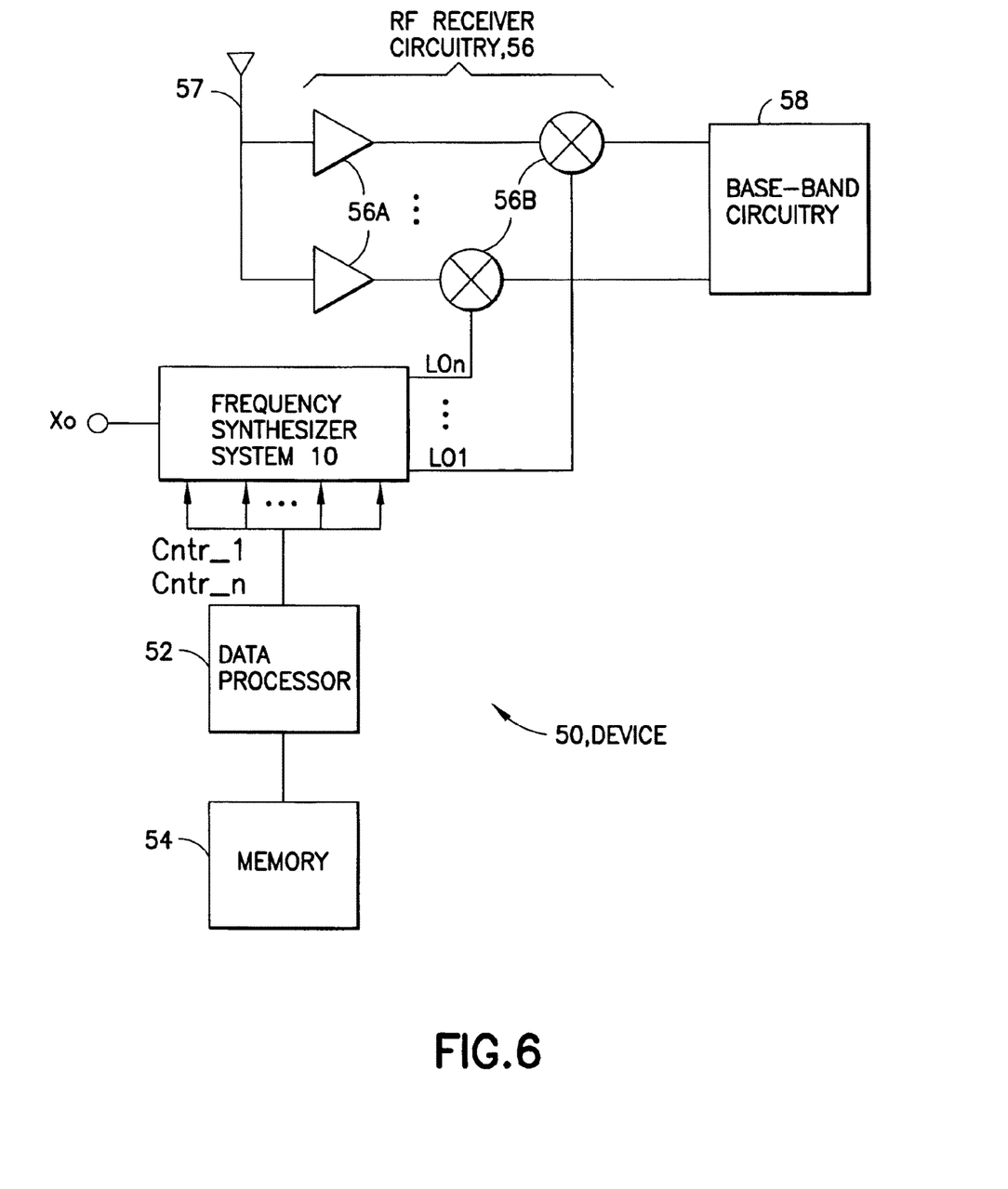
FIG. 6 is a simplified circuit diagram of a device that incorporates an instance of the frequency synthesizer described with respect to FIGS. 1-5.

FIG. 6 shows an exemplary device 50, such as a wireless communications device (e.g., a cognitive radio/multi-radio device) that is constructed to include the enhanced frequency synthesizer system 10 as described above with reference to FIGS. 1-5. The device 50 includes at least one controller, such as at least one data processor 52 that operates in accordance with program instructions stored in at least one storage medium, such as at least one memory 54. The data processor 52 sources control bus signals (cntr_1, . . . ,cntr_n) to the frequency synthesizer system 10 for setting individual ones of the output frequencies. These output frequencies form the LO signals that may be applied simultaneously to RF receiver circuitry 56. The RF receiver circuitry 56 may include multiple instances of receivers 56A and mixers 56B. The receivers 56A are configured to be connected with at least one, and possibly several antennas 57, and operate to simultaneously receive and downconvert multiple reception channels in multiple frequency bands. The RF receiver circuitry 56 may be implemented as a plurality of direct conversion receivers or as a plurality of superheterodyne-type receivers. In either case the downconverted signals from multiple reception channels are provided to at least one baseband circuitry block 58 to demodulate and decode received signaling and other data.

Note also that while shown in FIG. 6 as generating a LO signal for downconversion, the frequency synthesizer system 10 can be used as well for generating LO signals for use in IQ modulators/demodulators.

The RF receiver circuitry 56 may be embodied as an integrated circuit, as may the baseband circuitry 58. The frequency synthesizer system 10 may be embodied as part of the RF receiver circuitry 56, or it may be embodied separately there from. In some embodiments all of the circuitry shown in FIG. 6, including the data processor 52 and possibly also the memory 54, may be embodied in one integrated circuit module or package.

Note further that in some embodiments all or some of the functionality of the frequency synthesizer system 10 may be embodied by the data processor 10 or by another data processor, such as a high speed digital signal processor operating under control of a stored program.

Note further that while shown in the context of a radio receiver, the exemplary embodiments may be used as well to provide local oscillator and other frequency signals for a radio frequency transmitter, such as upconversion local oscillator signals in a multi-transmitter type of device.

The use of the direct period frequency synthesis architecture in accordance with the exemplary embodiments of this invention does not require the use of a phase locked loop, or a delay locked loop, or an analog frequency multiplier to produce the output signal, since the higher frequencies are generated by combining a plurality of lower frequency signals. This operation does not fundamentally create spurious tones.

The use of the exemplary embodiments of the multiphase phase accumulator enables the generation of multi-phase signals (e.g., 0, 90, 180, 270 degrees) for IQ modulators and demodulators. No additional dividers or polyphase filters are needed for IQ signal generation. In addition, any desired division of 360 degrees, other than the typically used 0, 90, 180, 270 degrees, can be implemented.

There are a number of advantages and technical effects that can be realized by the use of these exemplary embodiments. For example, the maximum output frequency of the frequency synthesizer 10 is increased, while falling edge generation serves to eliminate spurious tones due to pulse-width modulation. In addition, IQ signal generation is made possible.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, signal waveform diagrams, or by using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method, comprising:
   generating a plurality of reference phases of a reference signal; and
   selecting a sub-phase from each of the plurality of reference phases to form a set of selected sub-phases; where selecting operates in response to synchronized outputs of a multi-phase phase accumulator that operates synchronously in accordance with one of the sub-phases of the set of sub-phases.

2. The method of claim 1, further comprising combining in rising and falling edge combiners the rising and falling edges of the sub-phases of the selected set of sub-phases.

3. The method of claim 2, where combining further comprises selectively combining outputs of the rising and falling edge combiners.

4. The method of claim 1, where all of the outputs of the multi-phase phase accumulator are simultaneously synchronized once per multi-phase accumulation.

5. The method of claim 1, where the outputs of the multi-phase phase accumulator are each synchronized in turn once per multi-phase accumulation.

6. The method of claim 1, where the multi-phase phase accumulator comprises an n-phase second order sigma-delta accumulator, and where the outputs of the multi-phase phase accumulator are encoded.

7. The method of claim 6, where n=8, and where the outputs are encoded using a one-hot code.

8. The method of claim 6, where the multi-phase phase accumulator comprises a multi-stage array comprised of sub-accumulators and operates to perform a multiphase accumulation by an increment of n every clock cycle in each stage, where the increment is performed using a digital frequency control word having an integer part and a fractional part, where in each sub-accumulator of a first stage accumulation is performed as an integer part and a fractional part corresponding to a fixed-point representation of the digital frequency control word by multiplying each sub-accumulator input with a sequential integer that corresponds to the order of the sub-phase, and feeding the outputs of a last sub-accumulator to inputs of the other sub-accumulators, and where falling edge selection words are derived in another stage by taking an average of two neighbouring rising edge selection words, and further comprising dithering a carry input to a lowest order sub-accumulator of the first stage with a pseudo-randomly generated bit.

9. The method of claim 2, where the output signal comprises a local oscillator signal used for one of frequency upconversion, frequency downconversion, IQ modulation or IQ demodulation.

10. A frequency synthesizer, comprising:
    a transition generator;
    a set of transition selectors having inputs connected outputs of said transition generator;
    a multi-phase phase accumulator;
    a synchronizer having inputs connected to a plurality of outputs of said multi-phase phase accumulator and outputs connected to control inputs of said set of transition selectors, said synchronizer operating using at least one sub-phase for synchronizing the outputs of said multi-phase phase accumulator;
    rising and falling edge combiners having inputs connected to outputs of said set of transition selectors; and
    sub-phase combiners having inputs connected to outputs of said rising and falling edge combiners.

11. The frequency synthesizer of claim 10, where an output frequency is specified by an N-bit digital frequency control word that is input to said multi-phase phase accumulator, and where multi-phase phase accumulator generates phase information utilized by the set of transition selectors in the generation of the rising and falling edges of each sub-phase.

12. The frequency synthesizer of claim 11, where said rising and falling edge combiner utilizes a logical AND-function, where falling edge phase information is inverted, and where said sub-phase combiner combines successive sub-phases to a higher frequency signal utilizing a logical OR-function.

13. The frequency synthesizer of claim 11, where at least one additional sub-phase is used by said synchronizer for synchronizing outputs of said multi-phase phase accumulator, the additional sub-phase being generated from another digital control word by said multi-phase phase accumulator and an additional transition selector.

14. The frequency synthesizer of claim 11, where all of the outputs of the multi-phase phase accumulator are simultaneously synchronized by said synchronizer once per multi-phase accumulation.

15. The frequency synthesizer of claim 11, where the outputs of the multi-phase phase accumulator are each synchronized by said synchronizer in turn once per multi-phase accumulation.

16. The frequency synthesizer of claim 11, where said multi-phase phase accumulator is embodied as a (K+1)-phase $2^{nd}$-order sigma-delta multi-phase phase accumulator providing one-hot coded phase information used in a time-interleaved manner by said set of transition selectors, where phase information of a desired output frequency of the frequency synthesizer is generated from an N-bit digital control word representing a fixed-point number having M integer bits and N-M fraction bits that defines the period of the frequency synthesizer output in terms of transition generator unit delays.

17. The frequency synthesizer of claim 16, where said multi-phase phase accumulator is comprised of four stages, where first and second stages provide phase accumulation of rising edges, a third stage generates phase information of falling edges, and a fourth stage one-hot codes rising and falling edge digital phase information.

18. The frequency synthesizer of claim 17, where the first stage is comprised of K sub-accumulators that perform phase accumulation using an integer part and a fractional part, corresponding to the fixed-point representation of the digital frequency control word, by multiplying each sub-accumulator input with a sequential integer that corresponds to the order of the sub-phase, and feeding the outputs of a last sub-accumulator to the inputs of the other sub-accumulators.

19. The frequency synthesizer of claim 18, where the first stage further comprises circuitry to generate pseudo-random data used as a carry-in to a fractional accumulator to produce dithering for sigma-delta modulation performed in the second stage.

20. The frequency synthesizer of claim 18, where the second stage performs second-order sigma-delta modulation and comprises K sub-accumulators and a register to introduce a unit delay and provides a previous sum of a last sub-accumulator for use in generating falling edge phase information in the third stage, where outputs of the second stage comprise rising edge phase information.

21. The frequency synthesizer of claim 20, where the third stage generates falling edge phase information and comprises adders that form an average of the phase information of two neighboring rising edges.

22. The frequency synthesizer of claim 21, where the third stage further comprises circuitry to generate a synchronizing signal for said synthesizer as additional sub-phase phase information from last sub-phase rising edge phase information by adding a digital control word.

23. The frequency synthesizer of claim 11, embodied as an integrated circuit.

24. The frequency synthesizer of claim 11, where an output signal of the frequency synthesizer comprises a local oscillator signal used for one of frequency upconversion, frequency downconversion, IQ modulation or IQ demodulation.

* * * * *